United States Patent [19]
Anthony et al.

[11] Patent Number: 5,273,731
[45] Date of Patent: Dec. 28, 1993

[54] SUBSTANTIALLY TRANSPARENT FREE STANDING DIAMOND FILMS

[75] Inventors: Thomas R. Anthony, Schenectady; James F. Fleischer, Scotia, both of N.Y.

[73] Assignee: General Electric Company, Schenectady, N.Y.

[21] Appl. No.: 859,753

[22] Filed: Mar. 30, 1992

Related U.S. Application Data

[63] Continuation-in-part of Ser. No. 407,179, Sep. 14, 1989, Pat. No. 5,110,579.

[51] Int. Cl.⁵ .............................................. C01B 31/06
[52] U.S. Cl. ............................ 423/446; 156/DIG. 68; 427/577
[58] Field of Search ...................... 156/DIG.; 423/446; 427/39, 577; 521/86

[56] References Cited

U.S. PATENT DOCUMENTS

| | | | |
|---|---|---|---|
| 3,030,187 | 4/1962 | Eversole | 423/446 |
| 3,630,679 | 6/1968 | Angus | 423/446 |
| 4,767,608 | 8/1988 | Matsumoto et al. | 423/446 |
| 4,816,286 | 3/1989 | Hirose | 423/446 |
| 4,830,702 | 5/1989 | Singh et al. | 156/DIG. 68 |
| 4,997,636 | 3/1991 | Prins | 423/446 |
| 5,106,452 | 4/1992 | Kadono et al. | 423/446 |
| 5,110,579 | 5/1992 | Anthony et al. | 423/446 |

OTHER PUBLICATIONS

Unusually High Thermal Conductivity in Diamond Films, J. E. Graebner et al., Submitted to Applied Physics Letters (1991) pp. 1-10, plus Figures and Abstract.
Diamond-Ceramic Coating of the Future, Karl E. Spear-J. Am. Ceram. 1 Soc., 72 (2) 171-91 (1989) 4 random pages-171, 173, 186 and 187.

*Primary Examiner*—Robert Kunemund
*Attorney, Agent, or Firm*—William A. Teoli; William H. Pittman

[57] ABSTRACT

Substantially transparent polycrystalline diamond film is provided having a thickness greater than 50 microns which can be used in glazing applications and as a heat sink in microelectric applications. A mixture of hydrogen and methane is conveyed into a heat filament reaction zone which is adjacent to an appropriate substrate, such as a molybdenum substrate to produce non-adherent polycrystalline substantially transparent diamond film.

18 Claims, 10 Drawing Sheets

SUBSTANTIALLY TRANSPARENT FREE STANDING DIAMOND FILMS

CROSS REFERENCE TO RELATED APPLICATION

This application is a continuation in part of copending application Ser. No. 07/407,179, filed Sep. 14, 1989 now U.S. Pat. No. 5,110,579 and incorporated herein by reference. Reference also is made to copending application Ser. No. 07/661,965, filed Feb. 28, 1991.

BACKGROUND OF THE INVENTION

The present invention relates to vapor deposited substantially transparent free standing polycrystalline diamond films. More particularly, the present invention relates to substantially transparent diamond films having a thickness of at least 50 microns and a measurable light transmittance which is thickness dependent.

As taught by Spear, Diamond-Ceramic Coating of the Future, Journal of American Ceramics Society, 72[2]171-91 (1989), the growth of single-crystal films of diamond is critical to many electronic and optical applications, but it is a feat that has not been achieved except for homoepitaxial growth on diamond substrates. There is reported by Peter K. Backmann, et al in the May 15, 1989, edition of Chemical and Engineering News, on page 38, that vapor deposited diamond heat sinks have been developed using plasma jet deposition to produce polycrystalline material up to $4 \times 6 \times 1$ millimeter.

In Japanese patent 85,141,697, it is reported that free-standing diamond films have been found useful as diaphragms for speakers. S. Kawachi et al, Japanese patent 85(60)-127,292, reports that 10 micron diamond films have been deposited on a graphite substrate. K. Fujii, et al, Japanese patent 85(60)-186,500 teaches that a 6.5 micron thick transparent film can be produced on a substrate using a methane-hydrogen mixture.

Although various procedures have been developed to make vapor deposited polycrystalline diamond film, it would be desirable to provide glazing materials and heat sinks in the form of free-standing polycrystalline transparent diamond films having thicknesses of from 50 to 5000 microns with lateral dimensions exceeding 10 millimeters. As used hereinafter, the term substantially transparent is also intended to include translucent which means a material which is capable of transmitting light.

SUMMARY OF THE INVENTION

The present invention is based on the discovery that vapor deposited transparent polycrystalline diamond film can be made at thicknesses greater than 50 microns by passing a hydrogen-methane mixture through a filament heated reaction zone adjacent to a suitable substrate, such as a molybdenum substrate, where the hydrogen-methane mixture introduced into the reaction zone has from about 0.1 to about 2 volume percent of methane, based on the total volume of hydrogen and methane. Surprisingly, a substantially transparent non-adherent and free standing polycrystalline diamond film can be made.

STATEMENT OF THE INVENTION

There is provided by the present invention a continuous free-standing substantially transparent polycrystalline diamond film having a thickness of at least 50 microns.

The present invention is also directed to a continuous free-standing, substantially transparent, polycrystalline diamond film having a thickness of at least 50 microns, and when examined for transparency at a thickness of about 300 microns, it has an absorbance of less than about 1.6 when using light having a wavelength in the range of between about 300 to 1400 nanometers, and it has an absorbance of less than about 0.2 when using light having a wavelength in the range of between about 1400 to about 2400 nanometers.

In another aspect of the present invention, there is provided a method of growing a continuous free standing, non-adherent substantially transparent polycrystalline film on the surface of a substrate, which diamond film has a thickness of at least 50 microns, comprising, passing a hydrogen-methane mixture at a pressure of about 1 to about 50 torr through a heated filament reaction zone which is sufficient to generate active carbon-hydrogen species and provide a temperature of about 600° C. to 1000° C. on the surface of the substrate, where the hydrogen-methane mixture introduced into the heated filament reaction zone has from about 0.1 to about 2 volume % of methane based on the total volume of hydrogen and methane.

Although the diamond film made in accordance with the practice of the invention can transmit light, the polycrystalline nature of the film can result in light scatter which can interfere with clarity. In addition, a material of high refractive index can reflect incident light which also contributes to a reduction in transmittance. Transmittance can be converted to absorbance which is a quantitative relationship similar to the Beers-Lambert Law as follows:

$$\frac{I}{I_o} = e^{-kb} \qquad (1)$$

where $I_o$ is the incident light, I is the transmitted light, b is the diamond thickness and k is the absorption coefficient.

The light absorbance of a material capable of transmitting light is defined by the formula:

$$A = -\log \frac{I}{I_o}. \qquad (2)$$

Percent transmission "%T" is defined as:

$$\% T = 100\% \frac{I}{I_o}. \qquad (3)$$

However, the %T of diamond film is difficult to calculate directly because as previously indicated, scatter and reflectance must be considered. The apparent transmission $T_A$ of a diamond film can be calculated if the amount of transmitted light which includes both unscattered "$I_u$" and scattered "$I_s$", can be measured. The $T_A$ then can be calculated as follows:

$$T_A = \frac{I_u + I_s}{I_o}. \qquad (4)$$

The %T can be calculated from $T_A$ if the reflectance "R" can be measured as shown as follows:

$$\% T = \frac{T_A \times 100}{100 - R}.$$

Figure 1:
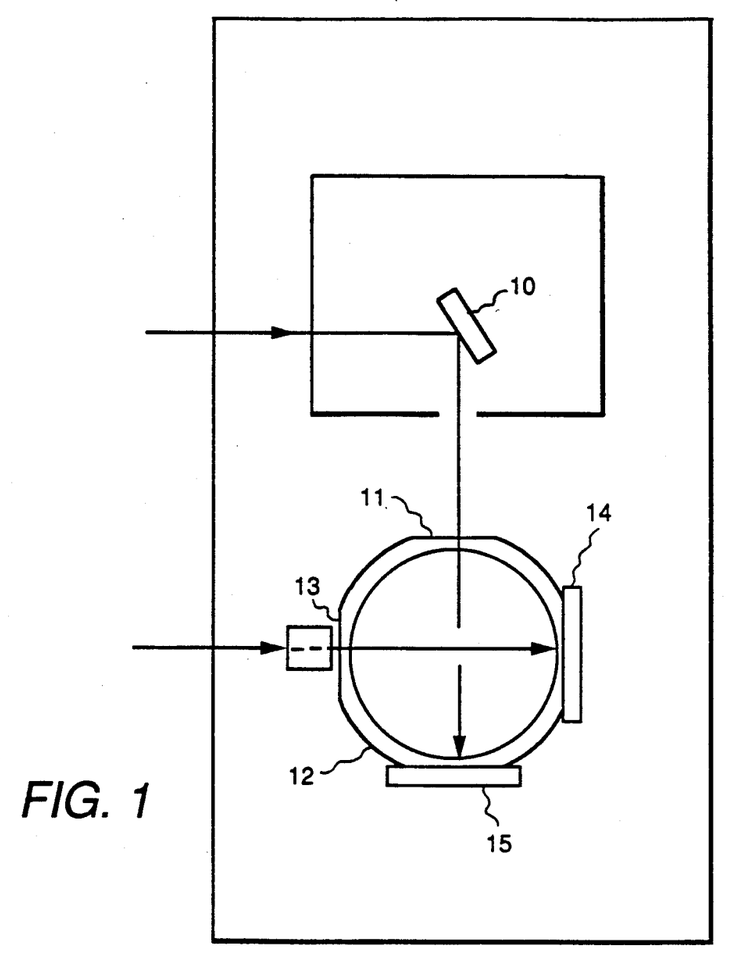
FIGS. 1-3 show a schematic of a portion of an Hitachi 60 mm integrating sphere; there is also shown a procedure for measuring light transmitted through a diamond film secured to the entrance aperture of the integrating sphere and a procedure used for directly measuring reflectance from a 300 micron diamond film using light over the range of about 300 nm to about 2500 nm.

FIG. 1 is a schematic of a portion of an Hitachi 60 mm integrating sphere having an entrance and exit aperture and reference points for calibration. The integrating sphere is capable of measuring total transmitted light including $I_s$ and $I_u$ shown in formula (4) and reflected light, R, having both specular and diffused components, over the visible -NIR light range. It is used as an accessory in the Model U-3410 Recording Spectrophotometer of Hitachi Instruments Inc., Danbury, Conn.

More particularly, FIG. 1 shows a reflecting mirror at 10 for incident light, an entrance aperture at 11, an exit aperture at 12 and reference points at 13 and 14 for calibration.

FIG. 1 also shows at the integrating sphere exit, a Spectralon Reflectance Calibration Standard from Lab Sphere Inc., North Sutton, N.H. This standard is used to calibrate the base line so that the intensity of incident light, $I_o$, can be set at 100%.

Figure 2:
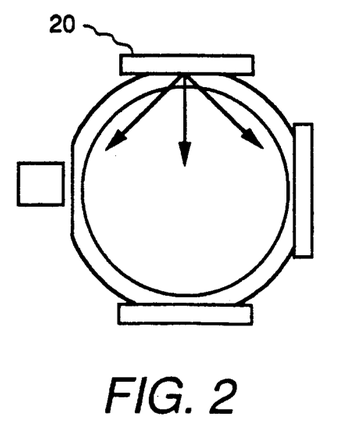

FIG. 2 shows the procedure for measuring the transmitted light $I+I_s$ through a 300 micron diamond film, from light transmitted at a wavelength in the range between about 300 to 2500 nm. The diamond film is secured to the entrance aperture of the integrating sphere.

Figure 3:
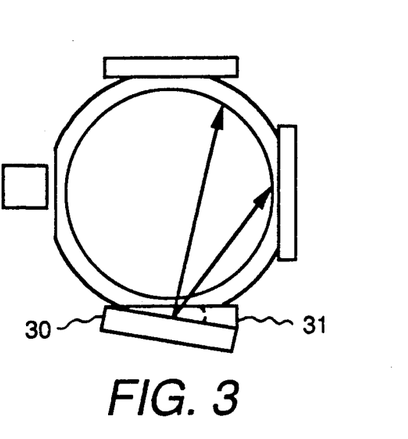

FIG. 3 shows the procedure used for directly measuring reflectance from a 300 micron diamond film at 30 using light over the range of about 300 nm to about 2500 nm. The diamond film is secured to an angular spacer at 31.

Figure 4:
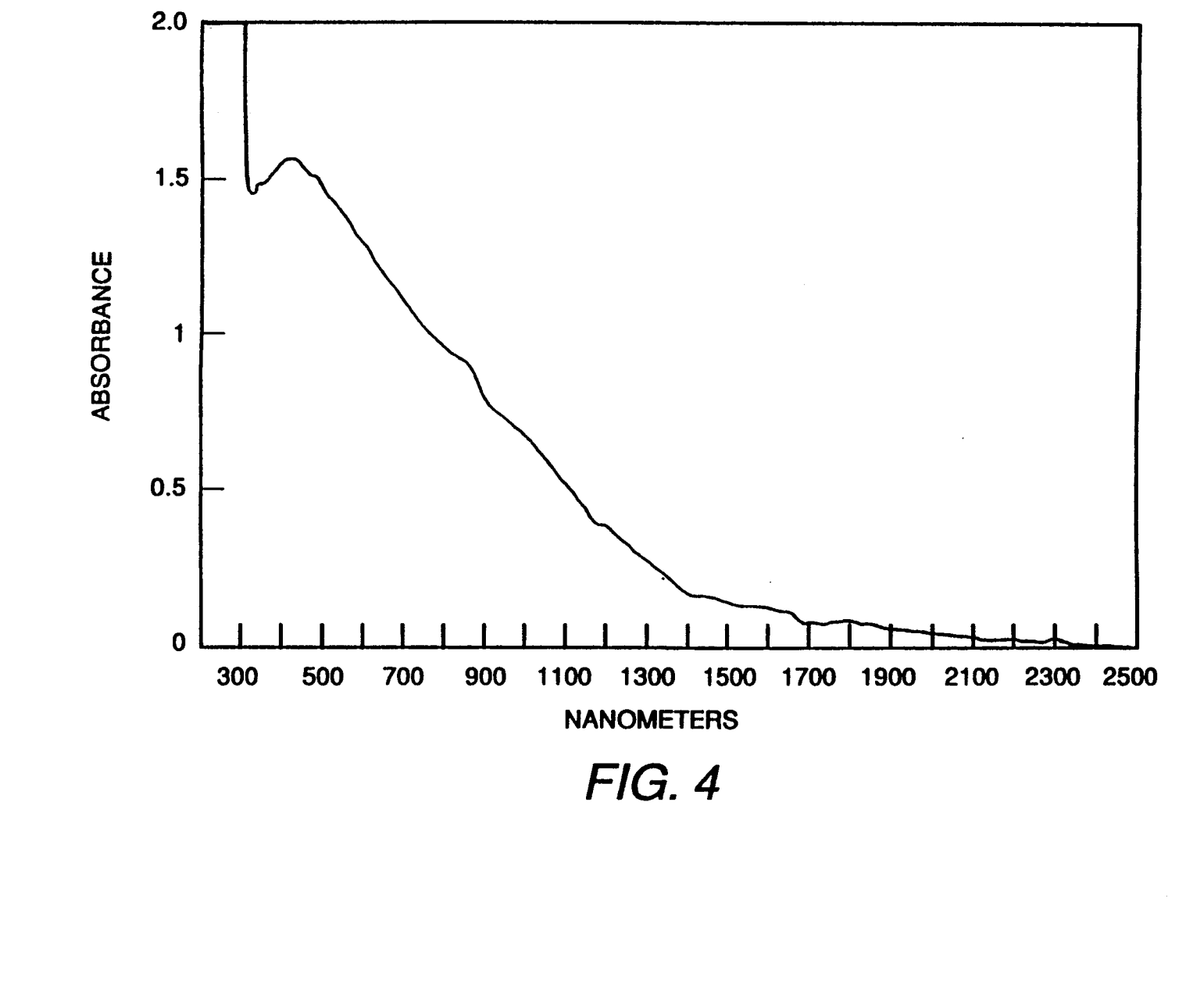
FIG. 4 is a graph showing the absorbance of a 300 micron diamond film resulting from the transmission of light over a range of 300 nm to about 2500 nm.

FIG. 4 is a graph showing the absorbance corrected for both scatter and reflectance of a 300 micron diamond film made in accordance with the invention which resulted from the transmission of light over the range of about 300 nm to about 2500 nm.

Figure 5:
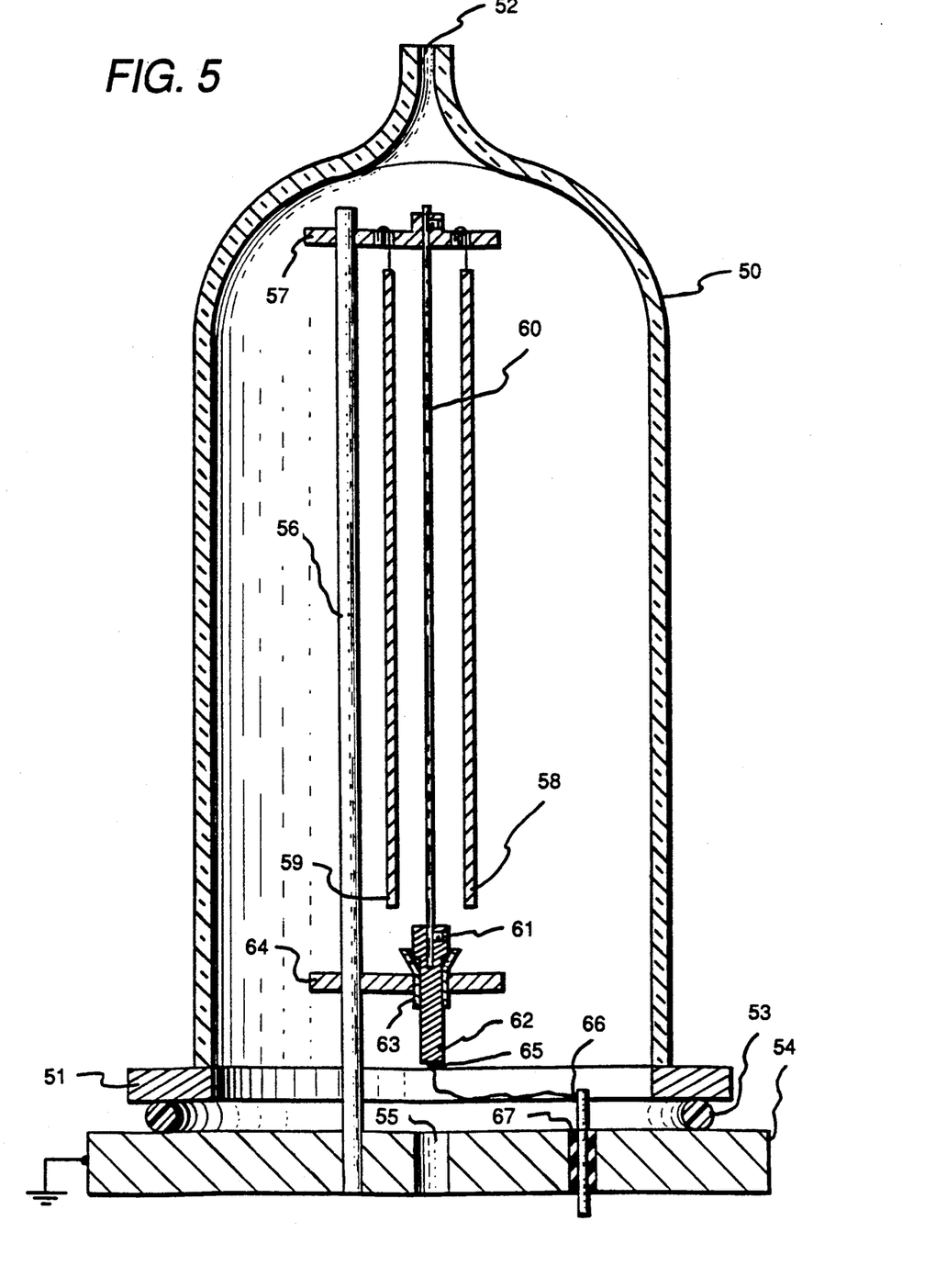
FIG. 5 is an apparatus used in making transparent crystalline diamond film of the present invention.

A typical apparatus which can be used to form the transparent polycrystalline diamond film of the present invention is shown by FIG. 5. FIG. 5 shows a quartz bell jar having a metal flange which rests on a base. Inside the quartz bell jar, there is shown a support structure for a filament and several adjacent substrate sections.

More particularly, there is shown a quartz bell jar at 50 which can be 20"-30" tall and about 4"-6" wide having a metal collar at its base at 51 and a gas inlet at the top at 52. The metal collar portion rests on a rubber seal at 53 which can be Neoprene rubber. The rubber seal is supported by a metal base, such as steel base structure at 54 which has a vacuum opening at 55.

Inside the quartz bell jar there is shown a supporting stand at 56 for an extension at 57 for holding several substrate structures, such as molybdenum at 58 and 59 and a filament at 60. The filament is secured by a screw at 61 to a metal plug at 62 which passes through a quartz insulating collar at 63 which is supported by an extension at 64. Electrical contacts are shown from the plug at 65 to a stud at 66 which is insulated from the metal base at 67.

Figure 6:
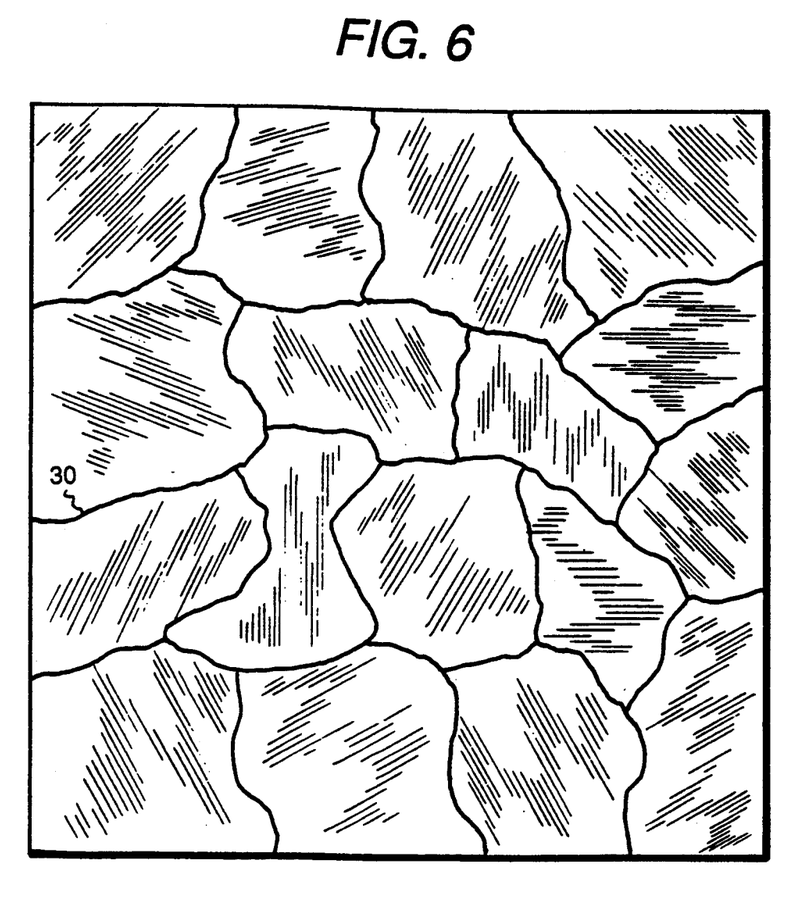
FIG. 6 shows a top view through an optical microscope of columnar diamond crystals of the polycrystalline diamond film of the present invention.

Reference also is made to FIG. 6, showing a top view through an optical microscope of 10 to 200 micron columnar diamond crystals of the polycrystalline diamond film of the present invention separated by atomic grain boundaries such as shown at 30.

Figure 7:
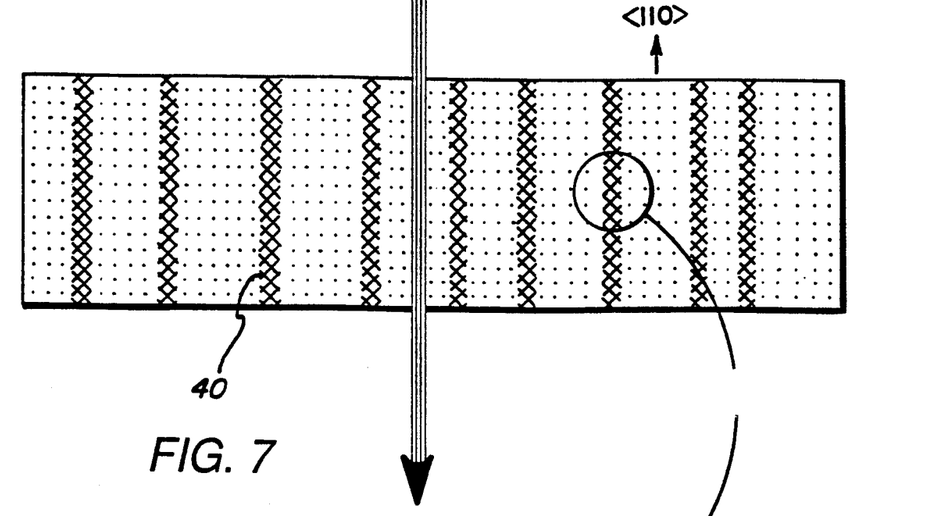
FIGS. 7 and 7a show the polycrystalline diamond film in cross section and in detail and the substantially transparent columns of diamond crystals having a <110> orientation perpendicular to the bases.
Figure 7A:
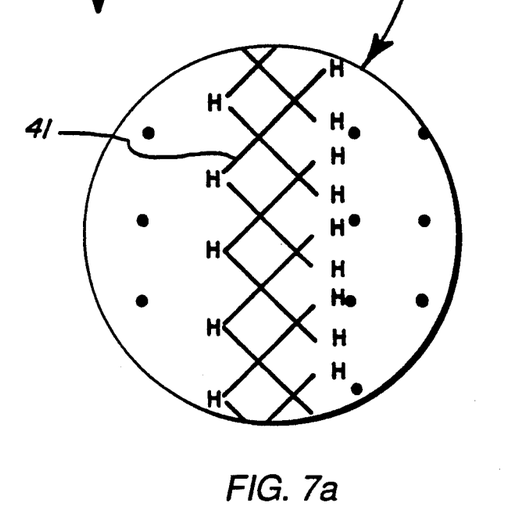

A further reference to the polycrystalline diamond film of the present invention is shown by FIG. 7. A side view of the polycrystalline diamond film in cross section, and in detail which further illustrates the substantially transparent columns of diamond crystals having a <110> orientation perpendicular to the base. Grain boundaries between adjacent diamond crystals having hydrogen atoms saturating dangling carbon bonds are shown at 40 and in detail at 41, where at least 50% of the carbon atoms are believed to be tetrahedrally bonded based on Raman spectroscopy, infrared and X-ray analysis.

A detailed discussion of Miller Indices describing crystal planes of atoms differentiating between <010>, <110> and <111> orientation is shown on pages 65-69 *Elements of Material Science*, Second Edition, 1964, by Lawrence H. VanVlack of Addison-Wisley Publishing Company, Reading, Mass. which is incorporated herein by reference.

A detailed discussion on chemical bonding and structure discussing the hybridization theory and molecular geometry with respect to tetrahedral bonding of carbon atoms with hydrogen is shown by Ernest Griswold, *Chemical Bonding and Structure*, pages 55-102, 1968, Raytheon Education Company, which is incorporated herein by reference.

The following shows the dissociation of hydrogen and methane on a heated tungsten filament in accordance with the practice of the method of the present invention:

| | |
|---|---|
| $CH_4(g) + \square = CH_4(ad)$ | (1) |
| $CH_4(ad) = CH_3(ad) + H(ad)$ | (2) |
| $CH_3(ad) = CH_2(ad) + H(ad)$ | (3) |

-continued

| | |
|---|---|
| $CH_2(ad) = CH(ad) + H(ad)$ | (4) |
| $CH(ad) = C(ad) + H(ad)$ | (5) |
| $C(ad) = C(g) + \square$ | (6) |
| $CH(ad) = CH(g) + \square$ | (7) |
| $CH_2(ad) = CH_2(g) + \square$ | (8) |
| $CH_3(ad) = CH_3(g) + \square$ | (9) |
| $C(ad) = \square + C$ (in filament) | (10) |
| $H_2(g) + 2\square = 2H(ad)$ | (11) |
| $H(ad) = H(g) + \square$ | (12) |

$\square$ = vacant surface site
(g) = gaseous species
(ad) = species absorbed on surface The above mechanism is one possible explanation as to how the transparent diamond film grows on the substrate.

As described by Ch. Wild et al. in the *First Processing For International ECS Symposium on Diamond and Diamond-Like Films*, Los Angeles, May 7-12, 1989 for "Optical and Structural Characterization of CVD Diamond", which is incorporated herein by reference, infrared and Raman spectroscopy as well as X-ray diffraction have been used to investigate polycrystalline diamond films prepared by the method of the present invention. The absorption spectrum of a 400 micron thick free-standing diamond wafer established that the film had a hydrogen concentration of about 5000 part per million. Raman spectroscopy was used to establish that the observed polycrystalline film was significantly different from graphite, since it contained a significant level of tetrahydral carbon atoms. X-ray diffraction measurements revealed that the polycrystalline film made in accordance with the practice of the present invention had a preferential alignment of the <110> planes perpendicular to the growth direction and indicated that the diamond crystal grain boundaries had a 70° C.-90° C. orientation to the base.

The polycrystalline diamond films made in accordance with the practice of the present invention can be used in a variety of glazing applications. In addition the substantially transparent, free standing diamond film made in accordance with the practice of the invention having a thickness of at least 50 microns can have a thermal conductivity of at least about 4 W/cm-K and up to about 21 W/cm-K. Techniques which can be used to measure thermal conductivity of the substantially transparent diamond film are by Mirage, shown by R. W. Pryor et al., proceedings of the Second International Conference on New Diamond Science and Technology, p. 863 (1990). As a result, the diamond films can be employed as heat sinks or as semiconductors.

Figures 8, 8A:
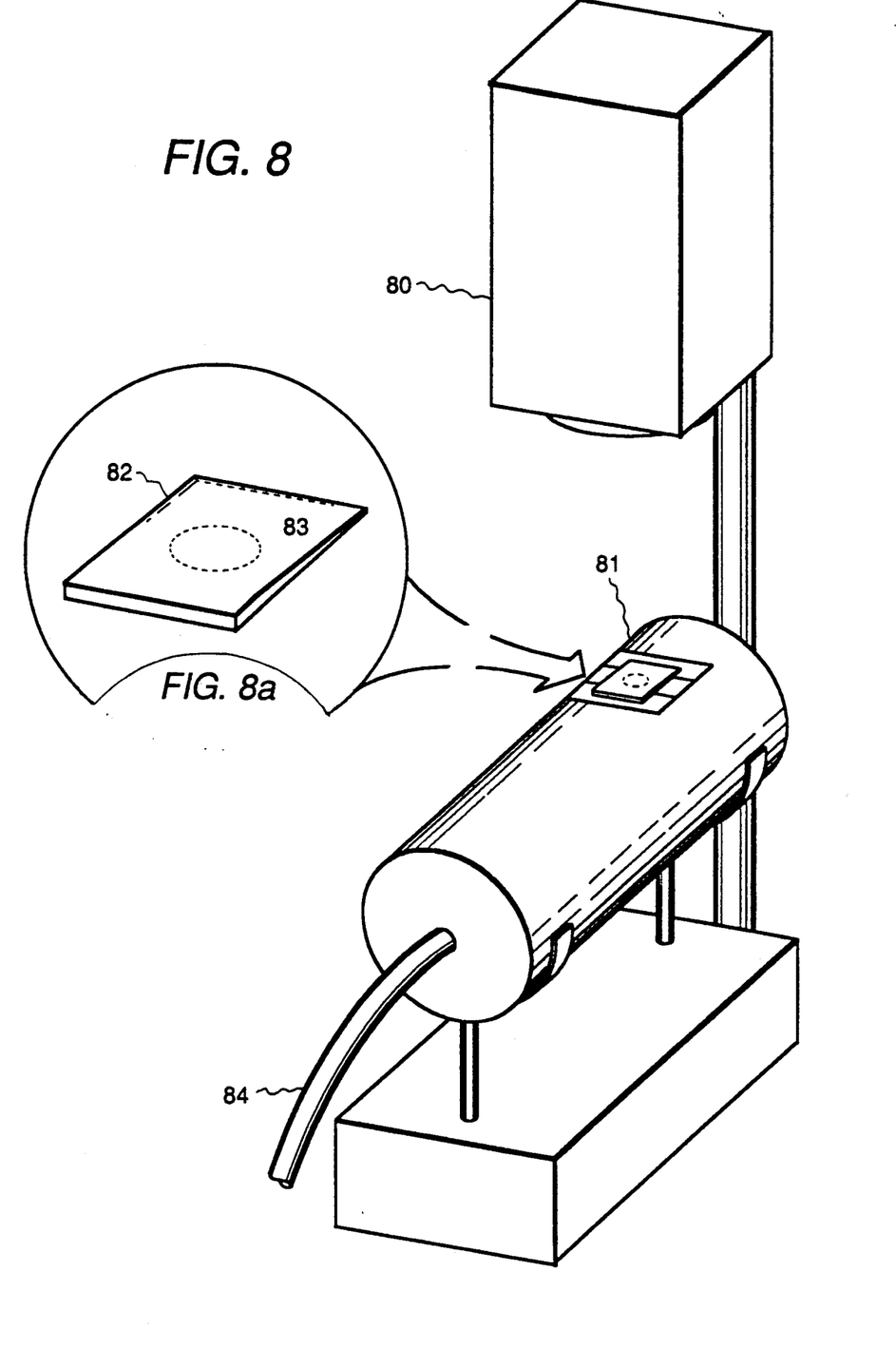
FIGS. 8 and 8a show apparatus for measuring the empirical transmittance of diamond film made in accordance with the practice of the present invention.

The "empirical transmittance" of diamond film made in accordance with the practice of the present invention can be measured with the apparatus shown in FIG. 8. There is shown in FIG. 8, a laser at 80, a photomultiplier tube at 81, a diamond film in the form of a wedge at 82, a hidden view of the photomultiplier tube aperture at 83 note, FIG. 8a and a conductor at 84 for photomultiplier current connected to an ammeter not shown. The empirical transmittance is expressed in photomultiplier tube current. No allowance is made for light lost due to reflectance or scattering over various film thicknesses.

More particularly FIG. 8 shows a commercially available laser such as a Spectra Physics Model 120, 5 mW He-Ne laser ($\lambda$=633 nm) which is about 85 mm from the surface of the diamond wedge. The diamond wedge rests on a 4 mm diameter aperture in the photomultiplier tube (PMT).

Figure 9:
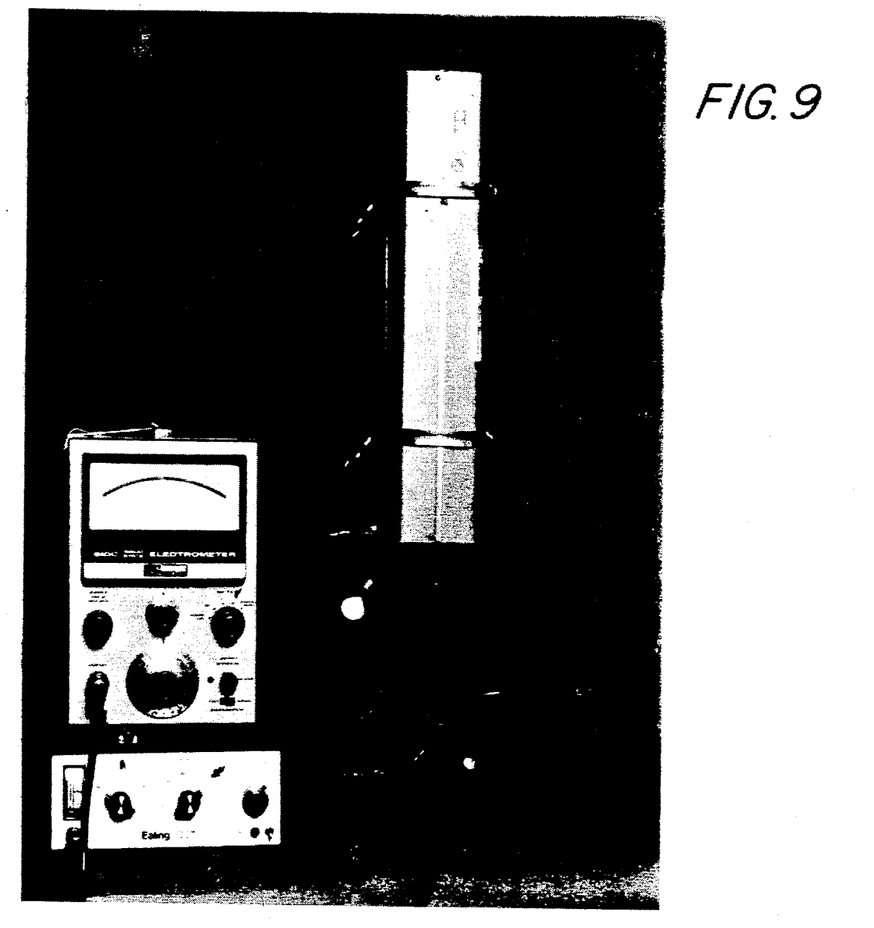
FIGS. 9 and 9a are photos of the overall FIG. 8 set-up including an ammeter.
Figure 9A:
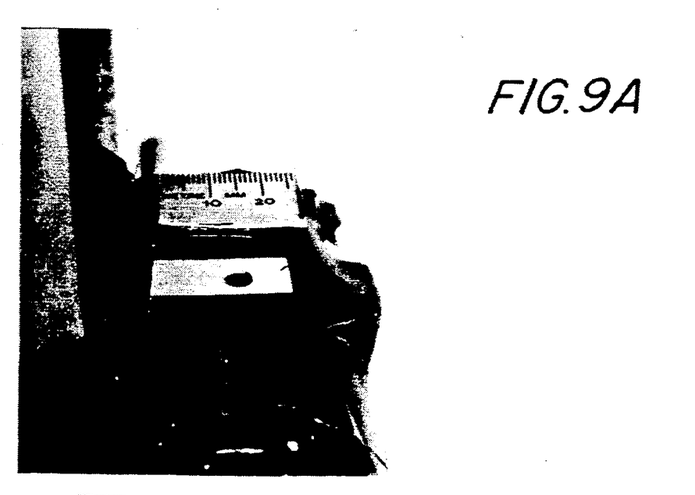
Figure 9B:
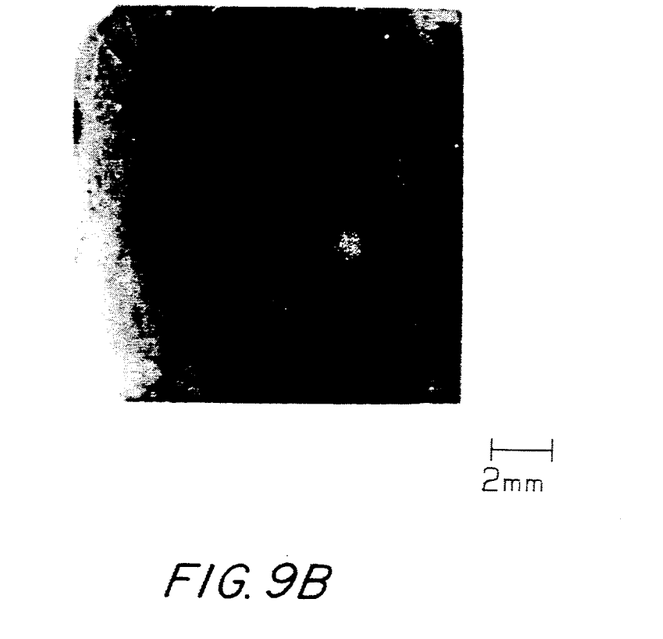
FIGS. 9b and 9c are photos of an upper view and side view of the wedge shaped diamond film.
Figure 9C:
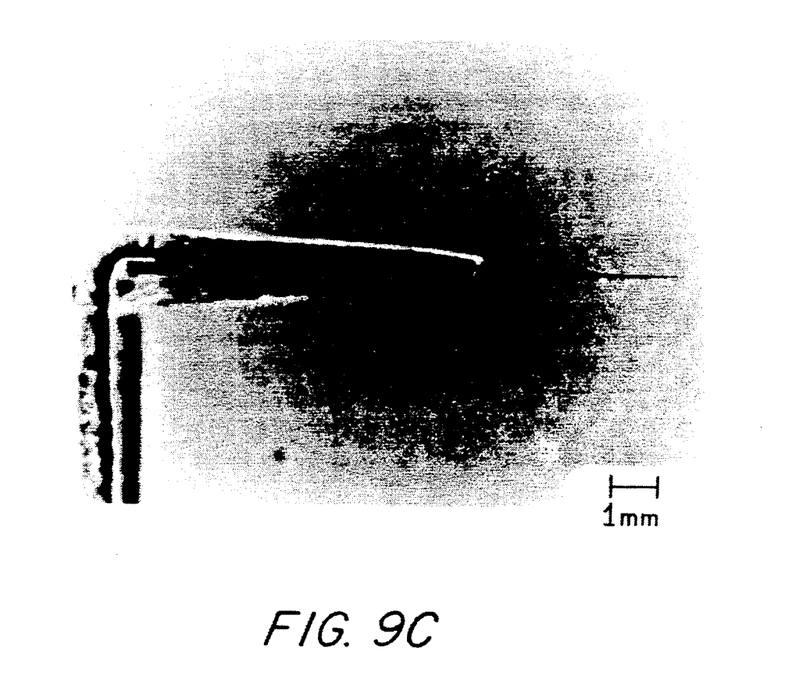

FIG. 9 is a photo of the overall FIG. 8 set-up including an ammeter; FIGS. 9a shows a close up of the photomultiplier tube aperture and 9b and 9c show a top view and side view of the 12.5 mm square diamond wedge.

Figure 10:
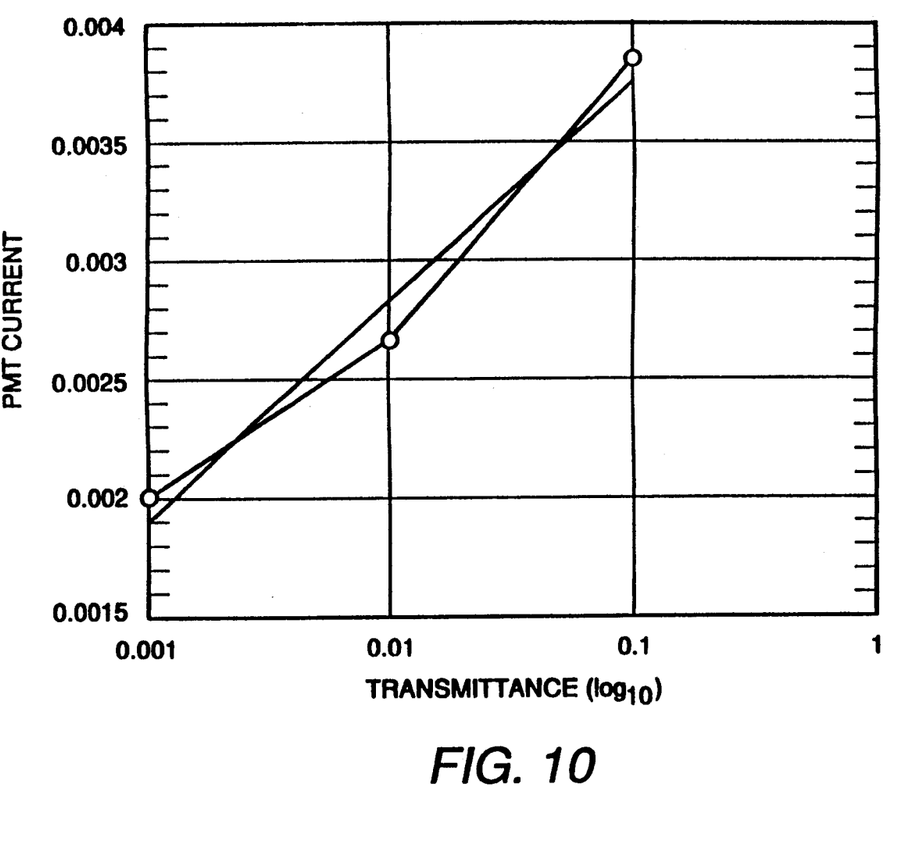
FIGS. 10 and 11 are graphs showing transmittances of light through the diamond film wedge measured in photomultiplier tube current over a range of thickness of the diamond wedge.

In FIG. 10 there is shown PMT current values expressed in terms of empirical transmittances ($\log_{10} T^1$) for three neutral density filters (0.1, 0.01 and 0.001) using light at 633 nm.

Figure 11:
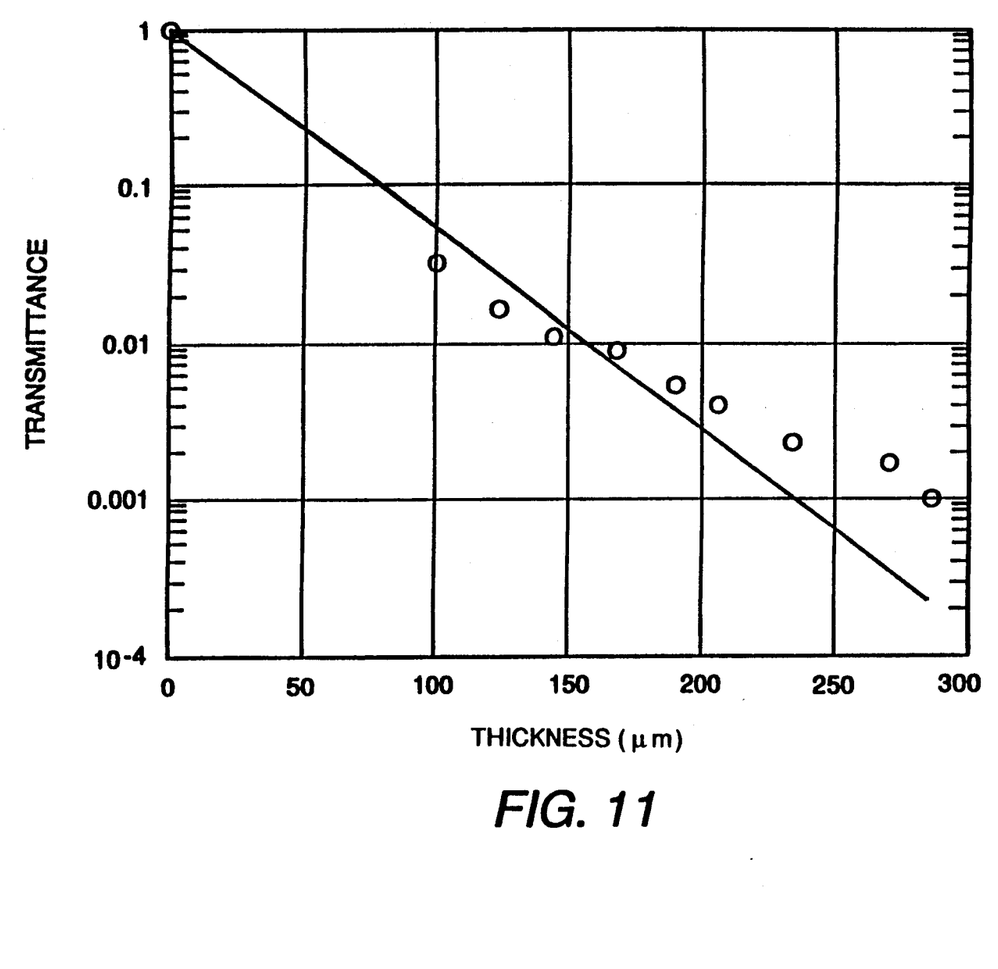

FIG. 11 shows the plot of $\log_{10} T^1$ across the wedge surface of the substantially transparent diamond film made in accordance with the method of the invention.

In order that those skilled in the art will be better able to practice the present invention, the following examples are given by way of illustration and not by way of limitation.

EXAMPLE 1

A mixture of 1.75 volume % of methane and 98.25 volume % of hydrogen, measured under atmospheric conditions, was introduced into a reaction vessel as shown by FIG. 4. A gas flow rate of about 400 cubic centimeters per minute was maintained. There was used two 1 ¼"×¼"×9" molybdenum substrates and 9 ½" #218 tungsten filament having a diameter of 030". The tungsten filament was maintained at a temperature between about 2020° to 2040° C. A separation of about 7-8 millimeters was maintained between the filament and the molybdenum substrate during the deposition which lasted approximately 30 days. The substrate temperature was estimated at about 800° C. during the deposition period.

At the termination of the 30 day deposition period, the apparatus was allowed to cool to room temperature. Substantially transparent polycrystalline diamond films having thicknesses of about 500 microns and lateral dimensions equivalent to the substrates separated from the substrate during the cooling period.

The diamond films were found to be of good crystalline quality as shown by Raman spectra having an intense peak at 1332 cm$^{-1}$. The diamond films were also found to have the characteristic two phonon adsorption of material diamond in the range of 1600-2650 cm$^{-1}$ by infrared spectroscopy. In addition the diamond films were found to have a thermal conductivity of about 12 W/cm-K based on the Mirage technique previously cited.

EXAMPLE 2

A mixture of 1.5 volume % of methane and 98.5 volume % of hydrogen measured under atmospheric conditions was introduced into a reaction vessel in accordance with example 1. A gas flow rate of 2.36 liters of hydrogen per minute and 36 cubic centimeters of methane per minute was maintained. There was used in the hot filament reactor 9 tungsten filaments 0.762 mm OD×27.31 mm long. The tungsten filaments were employed 6.5 millimeters away from the molybdenum substrate. The filament temperature was 2015° C., the substrate temperature was 801° C. and the pressure 10 torr.

At the termination of a 33 day deposition period, the apparatus was allowed to cool to room temperature. Substantially transparent polycrystalline diamond films having thicknesses of about 300 microns and lateral dimensions equivalent to the molybdenum substrates of Example 1 separated from the substrate during the cooling period. The diamond films were found to have a thermal conductivity of 4.4 to 4.6 W/cm-K.

A 12 ½ mm square section of the diamond film was then cut from the free-standing diamond film with a high powered laser. The apparent transmission of the above 12 ½ mm square section of diamond film was then measured using an Hitachi 60 mm diameter integrating sphere accessory for the Model U-3410 Recording Spectrophotometer for visible-NIR measurements from Hitachi Instruments Inc. from Danbury, Conn. White calibration standards, Spectralon Reflectance Calibration Standard from Lab Sphere, Inc., North Sutton, N.H. were placed over the sphere exit and reference points in order to calibrate the base line, thereby setting the intensity of the incident light $I_o$ to 100%. The 12 ½ mm square section of diamond film with the polished side facing the light source was then attached to the sphere entrance. The apparent transmission $T_A$ was then measured with the U-3410 spectrophotometer over a wavelength of 300 to 2500 nm. The apparent transmission included the light which was transmitted through the diamond film into the integrating sphere including the light which was scattered after it had passed through diamond film which was also captured by the integrating sphere. This measurement underestimated the true transmission because light reflected at film surfaces was not subtracted from the intensity of the incident beam.

At least a partial correction for the reflected loss was made by measuring the light reflected from the front surface of the diamond film. In making this measurement, it was necessary to allow transmitted light to pass through the diamond film and out of the measurement area while reflected light is collected and measured. An angular spacer (C792456) for measuring specular reflectance was then placed at the sphere exit. This modification of the integrating sphere changed the optics to allow collection of both specular and diffused components of the scattered light. Calibration standards were then placed behind the spacer and at the reference point and the instrument was calibrated to a base line of 100%. The standard was then removed and the diamond film was placed and secured to the spacer over the exit of the sphere, with the polished surface of the film facing the sphere. The reflectance R was then measured. Reflectance was used to correct the apparent transmission using the following equation, $$\% \ T = T_A 100/(100-R).$$

As shown previously in equations (2) and (3) above, % T can be converted to absorbance. The absorbance of the 300 micron diamond film was then plotted over a range of from about 300 nm to 2500 nm. The results are shown in FIG. 4.

EXAMPLE 3

The 12 ½ mm square diamond film section made in accordance with Example 2 was then formed into a wedge using an oblique mount, a conventional grinding apparatus composed of a large rotating metal disk which was continuously covered with an abrasive diamond/oil slurry. The empirical transmittance of the diamond wedge was then calculated from the PMT current using 3 neutral density filters having transmittances of 0.1, 0.01, and 0.001 using the apparatus shown in FIG. 8. There was used a Spectra Physics Model 120, $5 \times 10^{-3}$ helium-neon laser ($\lambda = 633$ nm). FIG. 10 shows the results of these calculations. FIG. 11 shows the empirical transmittance of the diamond wedge over various thicknesses. The results shown by FIGS. 10 and 11 do not include light lost by reflectance and scatter which can not be measured by this technique. However, these empirical values are useful in predicting transmittance with light having a particular wavelength over a range of thicknesses. Meaningful data can be obtained if the parameters with respect to the apparatus and diamond specifications are maintained.

Although the above examples are directed to only a few of the very many variables which can be used in the practice of the method of the present invention to make the polycrystalline diamond films, it should be understood that a much broader variety of conditions, apparatus arrangements and materials can be used as set forth in the description preceding this example.

What is claimed is:

1. A continuous free-standing substantially transparent polycrystalline diamond film having a thickness of at least 50 microns.

2. A continuous free-standing substantially transparent polycrystalline diamond film having a thickness of at least 50 microns and a thermal conductivity of at least about 4 W/cm-K.

3. A continuous free-standing substantially transparent polycrystalline diamond film in accordance with claim 1, having a thermal conductivity in the range of about 4 W/cm-K to about 21 W/cm-K.

4. A continuous free-standing, substantially transparent, polycrystalline diamond film having a thickness of at least 50 microns, and when examined for transparency at a thickness of about 300 microns, it has an absorbance of less than about 1.6 when using light having a wavelength in the range of between about 300 to 1400 nanometers, and it has an absorbance of less than about 0.2 when using light having a wavelength in the range of between about 1400 to about 2400 nanometers.

5. A substantially transparent diamond film in accordance with claim 1, wherein the diamond film has a thickness between about 100 microns and about 1000 microns.

6. A substantially transparent diamond film in accordance with claim 1, wherein the diamond film has a thickness between about 200 microns and about 500 microns.

7. A substantially transparent diamond film in accordance with claim 1, wherein the diamond film comprises substantially vertical columnar diamond crystals having a preferred <110> orientation perpendicular to the base of the film.

8. A substantially transparent diamond film in accordance with claim 7, having diamond grain boundaries separating the columnar diamond crystals wherein said boundaries have a 70° to 90° orientation to the base of the film.

9. A method of growing a continuous free standing, non-adherent substantially transparent polycrystalline film on the surface of a substrate, which diamond film has a thickness of at least 50 microns, comprising, passing a hydrogen-methane mixture at a pressure of about 1 to about 50 torr through a heated filament reaction zone which is sufficient to generate active carbon-hydrogen species and provide a temperature of about 600° C. to 1000° C. on the surface of the substrate where the hydrogen-methane mixture introduced into the heated filament reaction zone has from about 0.1 to about 2 volume % of methane based on the total volume of hydrogen and methane.

10. A continuous free-standing translucent polycrystalline diamond film having a thickness of at least 50 microns.

11. A continuous free-standing translucent polycrystalline diamond film having a thickness of at least 50 microns and a thermal conductivity of at least about 4 W/cm-K.

12. A continuous free-standing translucent polycrystalline diamond film in accordance with claim 11, having a thermal conductivity in the range of about 4 W/cm-K to about 21 W/cm-K.

13. A continuous free-standing, translucent, polycrystalline diamond film having a thickness of at least 50 microns, and when examined for transparency at a thickness of about 300 microns, it has an absorbance of ₅ than about 1.6 when using light having a wave-ᴧth in the range of between about 300 to 1400 nano-ᴎ..ːters, and it has an absorbance of less than about 0.2 when using light having a wavelength in the range of between about 1400 to about 2400 nanometers.

14. A translucent diamond film in accordance with claim 11, wherein the diamond film has a thickness between about 100 microns and about 1000 microns.

15. A translucent diamond film in accordance with claim 11, wherein the diamond film has a thickness between about 200 microns and about 500 microns.

16. A translucent diamond film in accordance with claim 11, wherein the diamond film comprises substantially vertical columnar diamond crystals having a preferred <110> orientation perpendicular to the base of the film.

17. A translucent diamond film in accordance with claim 16, having diamond grain boundaries separating the columnar diamond crystals wherein said boundaries have a 70° to 90° orientation to the base of the film.

18. A method of growing a continuous free standing, non-adherent translucent polycrystalline film on the surface of a substrate, which diamond film has a thickness of at least 50 microns, comprising, passing a hydrogen-methane mixture at a pressure of about 1 to about 50 torr through a heated filament reaction zone which is sufficient to generate active carbon-hydrogen species and provide a temperature of about 600° C. to 1000° C. on the surface of the substrate where the hydrogen-methane mixture introduced into the heated filament reaction zone has from about 0.1 to about 2 volume % of methane based on the total volume of hydrogen and methane.

* * * * *

UNITED STATES PATENT AND TRADEMARK OFFICE
CERTIFICATE OF CORRECTION

PATENT NO. : 5,273,731

DATED : December 28, 1993

INVENTOR(S) : Anthony et al.

It is certified that error appears in the above-identified patent and that said Letters Patent is hereby corrected as shown below:

On the title page, after item (73) Assignee, insert the following:

[*] Notice: The portion of the term of this patent subsequent to May 5, 2009 has been disclaimed.

Signed and Sealed this

Twenty-eighth Day of June, 1994

Attest:

BRUCE LEHMAN

*Attesting Officer*   *Commissioner of Patents and Trademarks*